(12) United States Patent
Ito et al.

(10) Patent No.: US 10,834,859 B2
(45) Date of Patent: Nov. 10, 2020

(54) COMPONENT MOUNTING DEVICE

(71) Applicant: FUJI CORPORATION, Chiryu (JP)

(72) Inventors: Hidetoshi Ito, Okazaki (JP); Mizuho Yamamoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 324 days.

(21) Appl. No.: 15/742,936

(22) PCT Filed: Aug. 7, 2015

(86) PCT No.: PCT/JP2015/072520
§ 371 (c)(1),
(2) Date: Jan. 9, 2018

(87) PCT Pub. No.: WO2017/026006
PCT Pub. Date: Feb. 16, 2017

(65) Prior Publication Data
US 2019/0075690 A1 Mar. 7, 2019

(51) Int. Cl.
*H05K 13/04* (2006.01)
*H02G 11/00* (2006.01)
(Continued)

(52) U.S. Cl.
CPC ........ *H05K 13/0406* (2018.08); *B25J 9/0096* (2013.01); *B25J 19/00* (2013.01);
(Continued)

(58) Field of Classification Search
CPC .......... H05K 13/0406; H05K 13/0408; H05K 13/0409; H05K 13/041; H05K 13/0404;
(Continued)

(56) References Cited

U.S. PATENT DOCUMENTS 6,073,342 A * 6/2000 Asai .................. H05K 13/0061
29/740
2008/0006653 A1* 1/2008 Dai .................... G01N 35/1074
222/75

FOREIGN PATENT DOCUMENTS

JP 2002-185191 A 6/2002
JP 2003-163492 A 6/2003
(Continued)

OTHER PUBLICATIONS

International Search Report dated Nov. 10, 2015 in PCT/JP2015/072520 filed Aug. 7, 2015.

*Primary Examiner* — Peter Dungba Vo
*Assistant Examiner* — Azm A Parvez
(74) *Attorney, Agent, or Firm* — Oblon, McClelland, Maier & Neustadt, L.L.P.

(57) ABSTRACT

Provided is a component mounting device including: an XY robot, a Z-axis slider attached to an X-axis slider of the XY robot so as to be movable in the Z-axis direction, a head loaded on the Z-axis slider, and a nozzle attached to head 30 so as to be movable in the Z-axis direction. With the component mounting device, a component supplied from a component supply unit is picked up by the nozzle, transported to a specified position on a board, and mounted. A flexible section with an external appearance with a U shape that is expandable and contractible in the X-axis direction and the Z-axis direction is arranged to the rear of a Y-axis slider. A portion of an X-axis wiring tube and a portion of a Z-axis wiring tube are bundled together in the flexible section.

4 Claims, 4 Drawing Sheets

(51) Int. Cl.
*B25J 19/00* (2006.01)
*B25J 9/00* (2006.01)
*B25J 19/02* (2006.01)

(52) U.S. Cl.
CPC ......... *H02G 11/00* (2013.01); *H05K 13/0404* (2013.01); *H05K 13/0409* (2018.08); *B25J 19/02* (2013.01)

(58) Field of Classification Search
CPC . H05K 13/04; B25J 9/0096; B25J 9/00; B25J 9/02
USPC .......................................... 29/739, 729, 700
See application file for complete search history.

(56) References Cited

FOREIGN PATENT DOCUMENTS

| | | | |
|---|---|---|---|
| JP | 2009-170528 A | | 7/2009 |
| JP | 2011-82334 A | | 4/2011 |
| JP | 2011082334 A | * | 4/2011 |
| JP | 2013-68303 A | | 4/2013 |
| WO | 2015/045033 A1 | | 4/2015 |

\* cited by examiner

COMPONENT MOUNTING DEVICE

TECHNICAL FIELD

The present disclosure relates to a component mounting device.

BACKGROUND ART

Conventionally, there are known component mounting devices that pick up a component supplied from a component supply device, transport the component to a specified position of a board, and mount the component. For example, in patent literature 1, as this type of component mounting device, disclosed is an item provided with a Y-axis slider, an X-axis slider attached to a front surface of the Y-axis slider, a rotary head loaded on the X-axis slider, and multiple nozzles attached to the rotary head movably in a Z-axis direction. With this kind of component mounting device, if the Z-axis direction stroke of the nozzle is long, this worsens throughput. Therefore, it may be considered to attach a Z-axis slider to the X-axis slider, and to load the rotary head on the Z-axis slider, such that by moving the nozzle in the Z-axis direction in a state with the rotary head positioned at a lower than normal position, the stroke of the nozzle in the Z-axis direction can be made shorter than normal.

CITATION LIST

Patent Literature

Patent literature 1: WO2015/045033

SUMMARY

However, if the X-axis slider is attached to the Z-axis slider, it is necessary to run new Z-axis wiring connected to the Z-axis slider, meaning that the construction of the component mounting device can no longer be compact, which worsens practicality. This point applies to the arrangement of tubes as well as wires.

The present disclosure takes account of such problems and an object thereof is to provide a component mounting device with a head loaded on a Z-axis slider attached to a slider of an XY robot so as to be movable in a Z-axis direction, wherein throughput is improved and less space is required for arranging wires and tubes.

A component mounting device of the present disclosure is for picking up a component supplied from a component supply device, transporting the component to a specified position on a board, and mounting the component on the board, the component mounting device including:

an XY robot;

a Z-axis slider attached to a slide of the XY robot so as to be movable in a Z-axis direction;

a head loaded on the Z-axis slider;

a nozzle attached to the head so as to be movable in the Z-axis direction;

a first wiring tube connected to a device loaded on a slider of the XY robot, the first wiring tube moving in accordance with operation of the slider;

a second wiring tube connected to a device loaded on the Z-axis slider, the second wiring tube moving in accordance with operation of the Z-axis slider; and a flexible section in which at least a portion of the first wiring tube and at least a portion of the second wiring tube are bundled, the flexible section being capable of expanding and contracting in a movement direction of the Z-axis slider and a movement direction of a slider of the XY robot.

With this component mounting devices, the Z-axis slider is attached to a slider of the XY robot, and a head is loaded on the Z-axis slider. Therefore, the head can be lowered to a position that is lower than normal. By performing pickup and mounting using a nozzle in that state, the stroke of the nozzle in the Z-axis direction is shorter by the amount that the head is lowered. This improves throughput. Also, at least a portion of a first wiring tube (a wiring tube of a slider of the XY robot) and at least a portion of a second wiring tube (a wiring tube of the Z-axis slider) are bundled together in a flexible section. Therefore, compared to a case in which first and second wiring tubes are arranged completely separately, the space required for wiring tubes can be reduced.

With a component mounting device of the present disclosure, the flexible section may have an intermediate section with a U shape (or C shape depending on the viewing angle) or an S shape when in a state with one end of the flexible section positioned directly below the other end of the flexible section. Because such a flexible section has a U-shaped or S-shaped intermediate section that is expandable and contractible, the construction is relatively simple, and the flexible section can move favorably in accordance with movement of the slider of the XY robot and the Z-axis slider.

With the component mounting device of the present disclosure, the Z-axis slider may be provided with a case that extends from a lower section of the Z-axis slider passing a space below the other slider of the XY robot to a space on an opposite side to a side on which the Z-axis slider is attached, and the flexible section may be provided at an intermediate section from the case to an upper section of the other slider at the space on the opposite side. Thus, because the flexible section is arranged in a space on the opposite side to the side on which the Z-axis slider or head is attached on the other slider of the XY robot, the flexible section does not get in the way when, for example, exchanging the head attached to the Z-axis slider.

In this case, the flexible section may be configured to bend so as not to protrude beyond a specified region of the space on the opposite side. Accordingly, it is possible to reduce the space required for operation of the component mounting device. At least a portion of the specified region may overlap a space surrounded by configuration members of the other slider of the XY robot.

DESCRIPTION OF EMBODIMENTS

Figure 1:
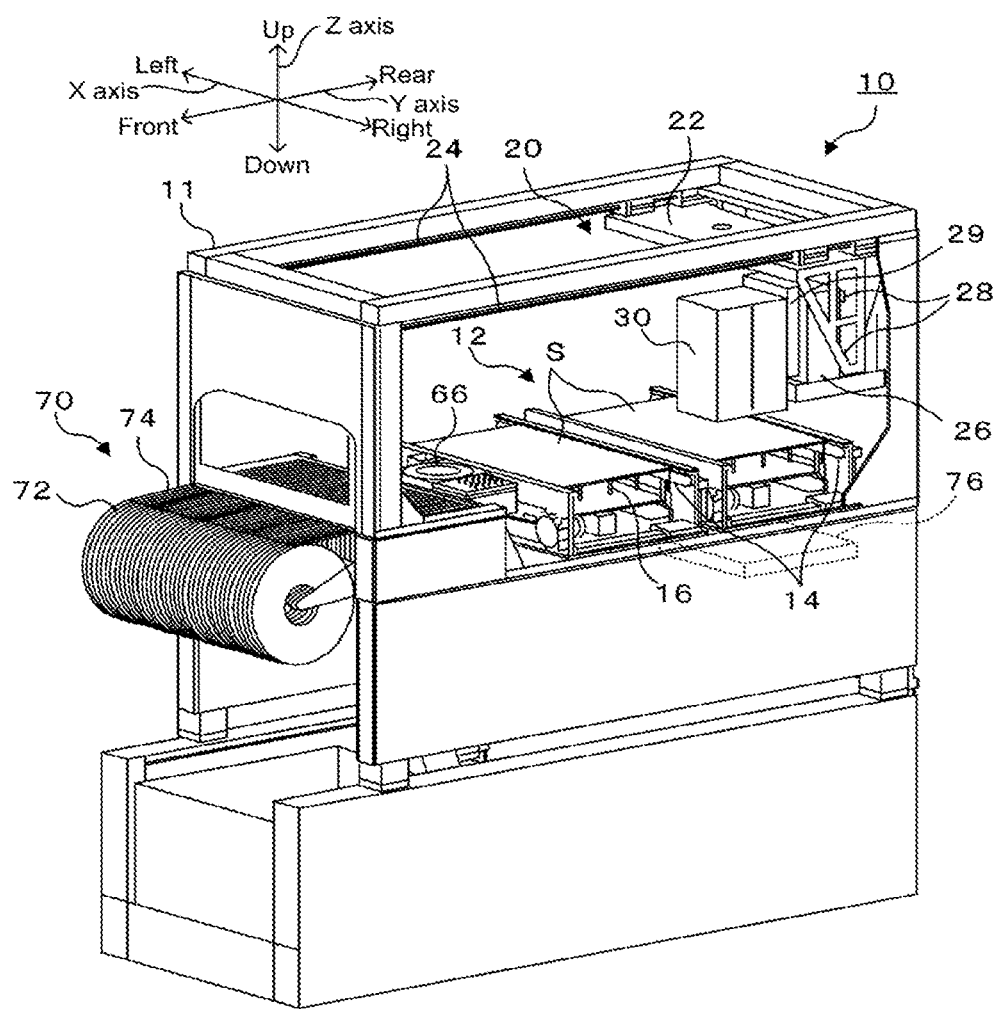
FIG. 1 is a perspective view showing the schematic configuration of component mounting device 10.
Figure 2:
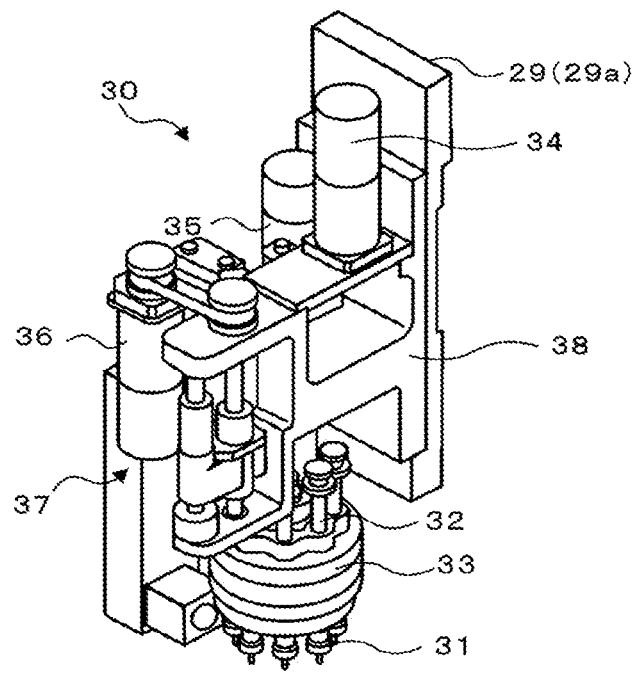
FIG. 2 is a perspective view of head 30.
Figure 3:
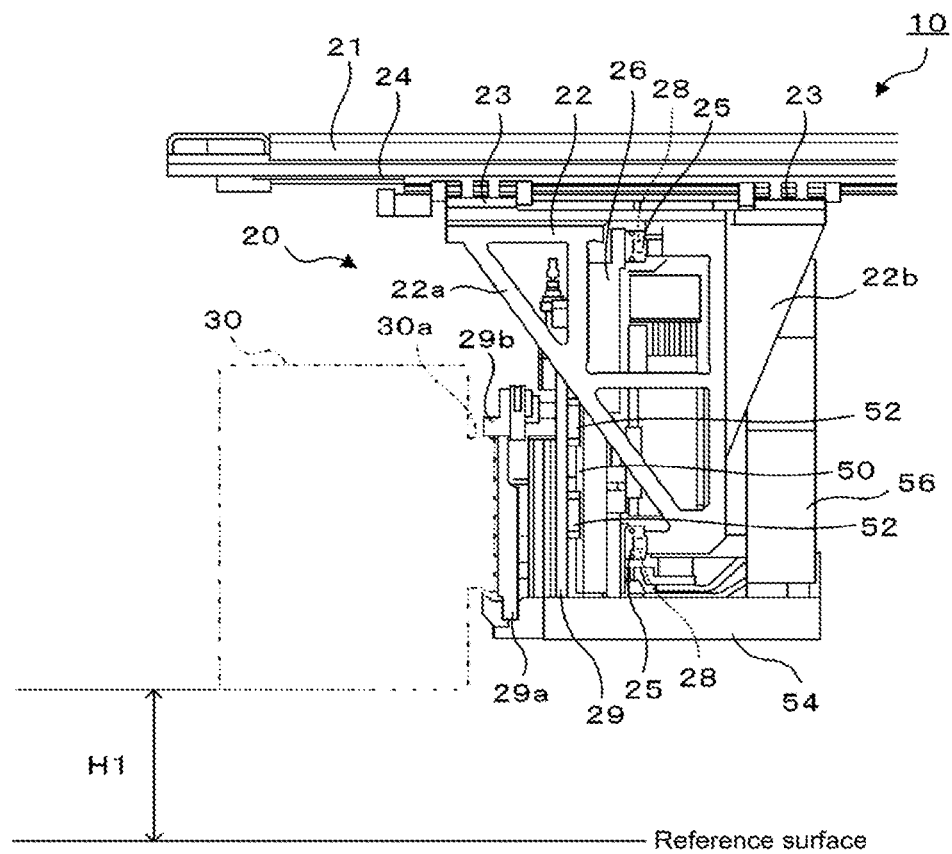
FIG. 3 is a side view of the main components of component mounting device 10.

An embodiment for carrying out the disclosure is described below with reference to the figures. FIG. 1 is a perspective view of the schematic configuration of component mounting device 10, FIG. 2 is a perspective view of head 30, and FIG. 3 is a side view of the main components of component mounting device 10. Note that, in FIG. 1, the left-right direction is the X-axis direction, the front-rear direction is the Y-axis direction, and the up-down direction is the Z-axis direction.

As shown in FIG. 1, component mounting device 10 is provided with board conveyance unit 12, XY robot 20, head 30, component camera 66, component supply unit 70, and controller 76.

Board conveyance unit 12 conveys board S from left to right using conveyor units 14 provided at the front and rear. Also, board conveyance unit 12 raises and supports board S from conveyor unit 14 by pushing up conveyed board S from below with support pins 16, and returns board S to conveyor unit 14 by lowering support pins 16 that are supporting board S.

XY robot 20 is provided with Y-axis slider 22 and X-axis slider 26. Y-axis slider 22 is movable along the pair of left-right Y-axis guide rails 24 provided on an upper level of main body frame 11 in the front-rear direction (Y-axis direction), in a state hanging from Y-axis guide rails 24. X-axis slider 26 is attached to X-axis guide rails 28 provided on a front surface of Y-axis slider 22 in a left-right direction (X-axis direction) and is movable along the X-axis guide rails 28. X-axis guide rails 28 are approximately the same length as the left-right width of Y-axis slider 22. XY robot 20 is controlled by controller 76 such that head 30 can be moved to any position on an XY plane.

Head 30 is removably loaded on Z-axis slider 29 that is attached to a front surface of X-axis slider 26 so as to be movable in the Z-axis direction. As shown in FIG. 2, head 30 is provided with frame 38, and items such as auto-tool 33, R-axis motor 34, θ-axis motor 35, and Z-axis motor 36 are provided on frame 38. Auto-tool 33 is cylindrical, and multiple nozzle holders 32 capable of removably holding nozzles 31 are provided in a circumferential direction. R-axis motor 34 revolves nozzles 31 attached to each nozzle holder 32 in the circumferential direction of auto-tool 33 by rotating auto-tool 33 around its own center axis line (R axis). θ-axis motor 35 rotates (on its own axis) each nozzle holder 32 attached to auto-tool 33 on its own center axis line (θ axis). Z-axis motor 36 is a member configuring nozzle raising and lowering mechanism 37, and lowers nozzle 31 together with nozzle holder 32 at a specified position on the revolving path of nozzles 31. Nozzle 31 attached to nozzle holder 32 picks up (holds) a component using negative pressure supplied to a suction port via an air tube, and releases pickup (releases holding) of the component by supplying positive pressure to the suction port. Note that, auto-tool 33 is removably attached to head 30, and can be exchanged with another auto-tool with a different quantity of nozzles 31.

Next, peripheral devices of head 30 are described based on FIG. 3. Y-axis slider 22 attached to Y-axis guide rails 24 via guides 23 so as to be slidable in the Y-axis direction is provided with Y-xis frame 22a provided with an inverted right-angled-triangular-shaped side surface attached to a frame main body extending in the left-right direction, and reinforcement ribs 22 b that have an inverted right-angled-triangular shape provided at multiple locations at the rear of Y-axis frame 22. X-axis slider 26 is attached to the pair of up-down X-axis guide rails 28 that extend on a front surface of Y-axis frame 22a in a left-right direction via guides 25 so as to be slidable in the X-axis direction. X-axis slider 26 is provided with an X-direction drive source (X-axis drive source) on a front surface of Y-axis frame 22a. This X-axis drive source may be a combination of a motor and ball screw, or a linear motor. Z-axis slider 29 is attached to the pair of left-right Z-axis guide rails 50 that extend on a front surface of X-axis slider 26 in an up-down direction via guides 52 so as to be slidable in the Z-axis direction. Z-axis slider 29 is movable in the Z-axis direction by a Z-axis ball screw mechanism that is not shown. Z-axis slider 29 is provided with case 54 that extends from a lower section of Z-axis slider 29 passing a space below Y-axis slider 22 to a space to the rear of Y-axis slider 22 (a space on the opposite side to a side on which Z-axis slider 29 that holds head 30 is attached). This case bundles together and guides to the space to the rear of Y-axis slider 22 a portion of or all of a wiring tube (X-axis wiring tube) connected to a device loaded on X-axis slider 26, and a portion of or all of a wiring tube (Z-axis wiring tube) connected to a device loaded on Z-axis slider 29. Examples of a device loaded on X-axis slider 26 are a cylinder (not shown) for backup pins, a Z-axis ball screw mechanism, an X-axis drive source, or the like. Examples of a device loaded on Z-axis slider 29 are: motors 34, 35, 36; air tubes for supplying negative pressure and positive pressure to nozzles 31; or the like. A wiring tube guided to the space to the rear of Y-axis slider 22 goes to an upper section to the rear of Y-axis slider 22 via flexible section 56 formed from down to up, passes through the inside of Y-axis frame 11a that extends in the Y-axis direction inside main body frame 11 in a state expandable and contractible in the Y-axis direction, and is connected in the end to controller 67 or a vacuum pump or drive source or the like that is not shown. Flexible section 56 has overall flexibility and is configured such that at least a portion of the flexible X-axis wiring tube and at least a portion of the flexible Z-axis slider wiring tube are lined up in a horizontal manner (in one level) and fixed by resin. Flexible section 56 has an intermediate section with a C shape (L shape) when in a state with one end of flexible section 56 positioned directly below the other end of flexible section 56 (refer to FIG. 5). Also, holding section 29a of Z-axis slider 29 includes engaging section 29b that fixes engaged section 30a provided on a rear surface of head 30 by sandwiching it from above and below, in a manner so as to be removable.

Component camera 66 is provided between component supply unit 70 and board conveyance unit 12 roughly in the middle in the left-right direction, and is arranged such that the imaging direction is upwards. Component camera 66 images a component held by nozzle 31 that passes above the camera, and outputs the captured image to controller 76.

Component supply unit 70 is provided with reels 72 and feeders 74. Tape, in which recesses that house a component are formed in a lengthwise direction, is wound on reel 72. Feeder 74 feeds components of tape wound on reel 72 to a specified component supply position. The tape wound on reel 72 includes film that covers the components, and the film is peeled by the time the component reaches the component supply position. Therefore, a component arranged at the component supply position is in a state able to be picked up by nozzle 31 of auto-tool 33 loaded on head 30.

Controller 76 is provided configured from a microprocessor built around a CPU and is also provided with ROM, an HDD, RAM, and the like. Controller 76 receives position signals from an X-axis position sensor that detects the position of X-axis slider 26, position signals from a Y-axis position sensor that detects the position of Y-axis slider 22, position signals from a Z-axis position sensor that detects the position of Z-axis slider 29, position signals from a nozzle position sensor that detects the position of nozzle 31, image signals from component camera 66 that can image a component held on nozzle 31, and the like. On the other hand, controller 76 outputs control signals to component supply unit 70, control signals to board conveyance unit 12, drive signals to an X-axis motor that moves X-axis slider 26, drive signals to a Y-axis motor that moves Y-axis slider 22, drive signals to Z-axis motor 36, drive signals to a motor of the Z-axis ball screw mechanism, drive signals to head 30, and the like.

Described next is operation of component mounting device 10, specifically operation of picking up a component supplied by component supply unit 70 using a nozzle and mounting the component at a specified position on board S.

Figure 4:
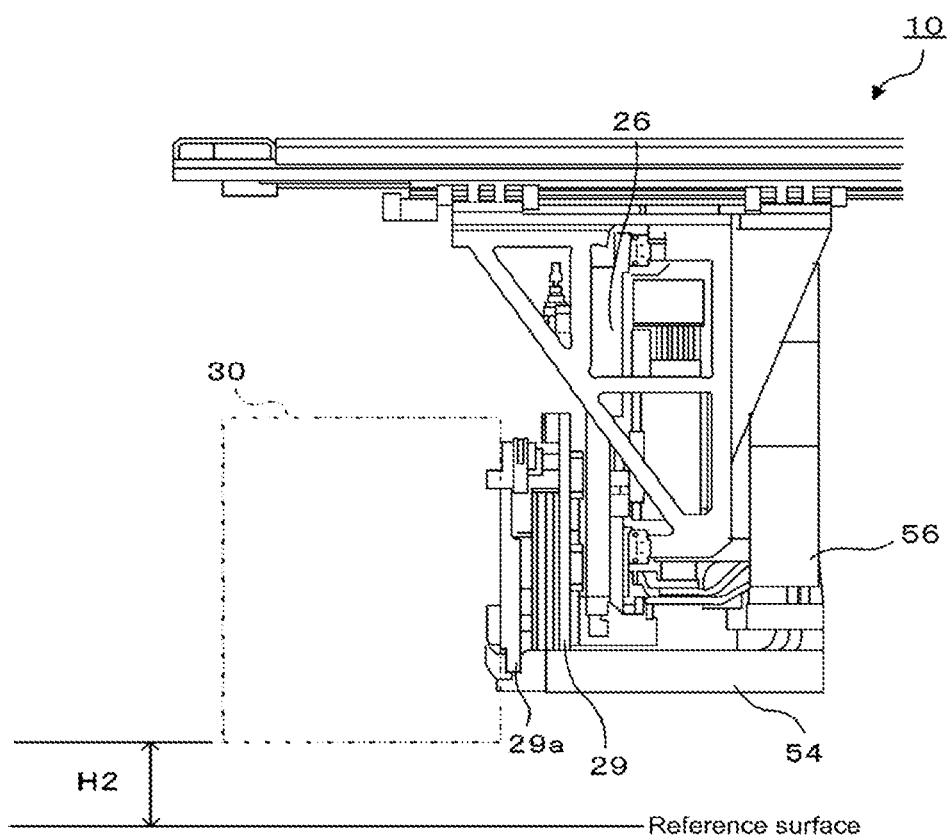
FIG. 4 is a side view of the main components of component mounting device 10.

First, controller 76 moves a first nozzle 31 to a position at which nozzle raising and lowering mechanism 37 is provided by controlling R-axis motor 34 such that auto-tool 33 rotates. Next, controller 76 controls XY robot 20 to move head 30 such that the first nozzle 31 is above the component supply position. Then, controller 76 controls a Z-axis ball screw mechanism, which is not shown, to move Z-axis slider 29 to a specified lower position that is lower than the normal position. When Z-axis slider 29 is in the normal position, as shown in FIG. 3, the height from the board surface to the lower surface of head 30 is H1. On the other hand, when Z-axis slider 29 integrated with holding section 29a, head 30, and case 54 are lowered with respect to X-axis slider 26 and reach the specified lower position, as shown in FIG. 4, the height from the board surface to the lower surface of head 30 is H2 (<H1). When performing pickup and mounting using nozzle 31 in that state, the stroke of nozzle 31 in the Z-axis direction is shorter by the amount that head 30 is lowered (=H1−H2). Next, controller 76 controls Z-axis motor 36 so as to lower first nozzle 31, and controls a pressure adjustment valve of an air tube such that negative pressure is supplied to nozzle 31. By this, the component is picked up by the first nozzle. Controller 76 picks up components in a similar manner using subsequent nozzles 31 until all the nozzles 31 of auto-tool 33 have picked up a component. Next, controller 76, after controlling XY robot 20 such that head 30 is moved above component camera 66, controls R-axis motor 34 and component camera 66 such that all the components picked up by the nozzles 31 are sequentially imaged by component camera 66. Controller 76 analyzes the captured images to determine the orientation of the components. Next, controller 76 controls XY robot 20 to move head 30 above board S, and mounts the components on board S in order from the component held by the first nozzle 31. The mounting procedure is basically a reverse of the pickup procedure, but instead of the pressure adjusting valve of the air tube being controlled such that negative pressure is supplied during pickup, control is performed such that positive pressure is supplied to nozzle 31 during mounting. Note that, controller 76, when picking up a component using nozzle 31 and when mounting a component held on nozzle 31 at a specified position on board S, appropriately controls θ-axis motor 35 to rotate nozzle 31 such that the orientation of the component is correct.

Figure 5:
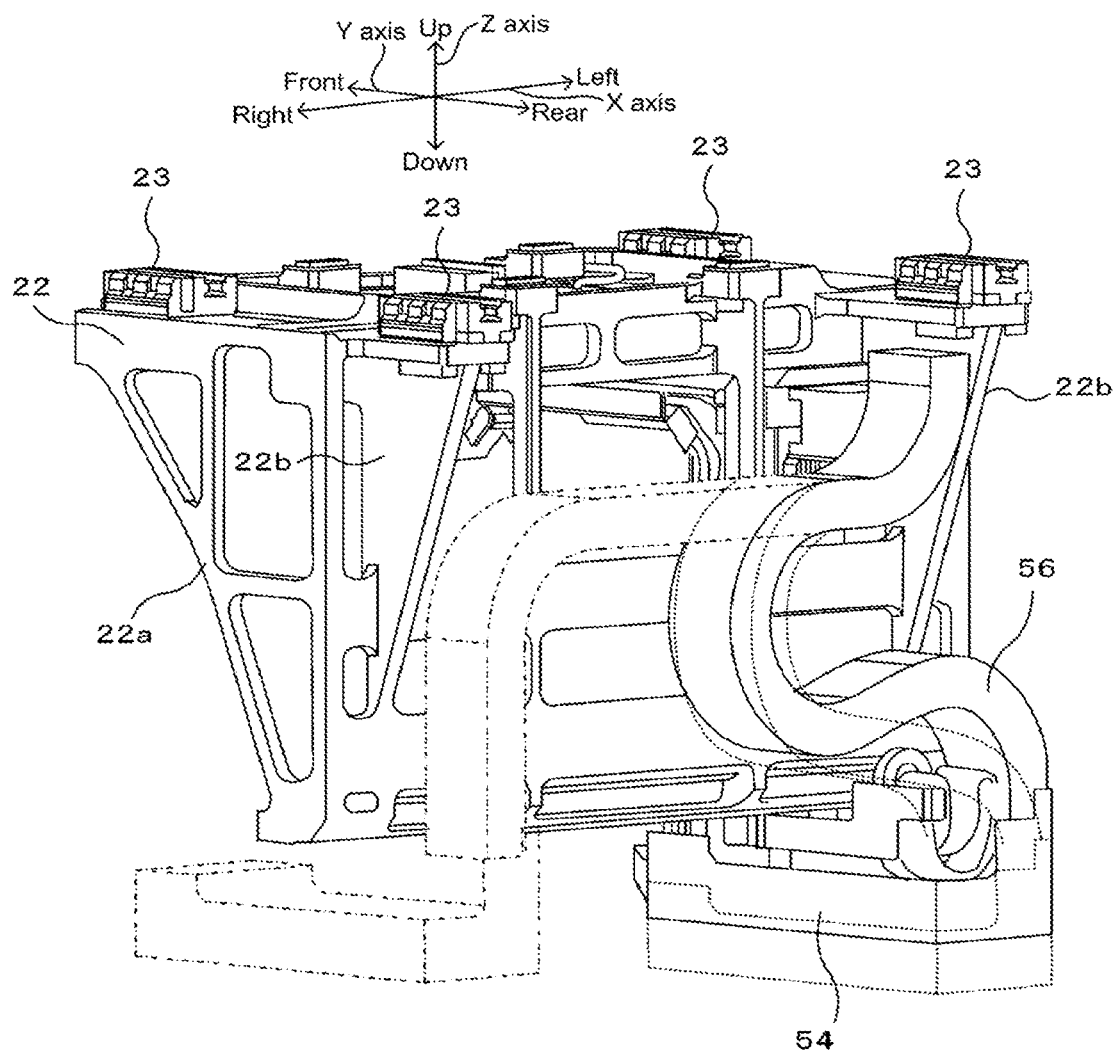
FIG. 5 is a perspective view from the rear of the main components of component mounting device 10.

While controller 76 is performing mounting of components on board S in this manner, in accordance with movement of X-axis slider 26 in the X-axis direction and movement of Z-axis slider 29 in the Z-axis direction, flexible section 56 of the tubes and wires expands and contracts in the same directions. The state in this case in shown in FIG. 5. FIG. 5 is a perspective view from the rear of the main components of component mounting device 10. For ease of understanding, X-axis slider 26, Z-axis slider 29, and head 30 are omitted from FIG. 5. Case 54 is provided as one body with Z-axis slider 29 attached to X-axis slider 26 to be movable in the Z-axis direction (refer to FIG. 3). Therefore, case 54 is movable in the X- and Z-axis directions. When case 54 is positioned at the uppermost left side (right side in FIG. 5) (as shown by the solid lines in FIG. 5), the lower end of flexible section 56 is positioned substantially directly below the upper end, and the external appearance of an intermediate portion of flexible section 56 is C-shaped. From that state, when case 54 is moved to the right side (left side in FIG. 5), case 54 is moved to the right maintaining that height, and the C-shaped portion of flexible section 56 extends sideways into a Z shape (shown by the single-dot dashed line in FIG. 5). On the other hand, if case 54 is moved downwards from the uppermost left side position (the solid lines in FIG. 5), case 54 moves down maintaining its position in the XY coordinates, and the C-shaped portion of flexible section 56 is stretched lengthwise. In this manner, flexible section 56 is able to move in accordance with operation of X-axis slider 26 and Z-axis slider 29 due to being able to expand and contract in the X-axis direction and Z-axis direction.

Correspondences between constituent elements of the present embodiment and constituent elements of the disclosure will be clarified here. X-axis slider 26 of the present embodiment corresponds to a slider of the XY robot of the present disclosure, and Y-axis slider 22 corresponds to another slider. Also, the X-axis wiring tube that moves in accordance with operation of X-axis slider 26 corresponds to a first wiring tube, and the Z-axis wiring tube that moves in accordance with operation of the Z-axis slider corresponds to a second wiring tube.

With component mounting device 10 described above, when pickup and mounting of a component using a nozzle is performed with head 30 in a position lower than normal, the stroke of nozzle 31 in the Z-axis direction is shorter by the amount that head 30 is lowered. This improves throughput. Also, because the X-axis wiring tube and the Z-axis wiring tube are bundled together with flexible section 56, compared to a case in which the X-axis wiring tube and the Z-axis wiring tube are arranged completely separately, the space required for wiring tubes can be reduced.

Also, because flexible section 56 is configured such that in a state with one end of flexible section 56 positioned substantially directly below the other end, an intermediate portion of flexible section 56 is C-shaped (U-shaped), and this intermediate portion deforms so as to be expandable and contractible Further, because flexible section 56 is arranged in a space on the opposite side to the side on which Z-axis slider 29 is attached on Y-axis slider 22, flexible section 56 does not get in the way when, for example, exchanging head 30 attached to Z-axis slider 29. Here, flexible section 56 is configured to bend without protruding from the specified region of the space on the opposite side (the region with a rear boundary of a hypothetical perpendicular surface including a line that connects points of a rear upper side of reinforcement ribs 22b on both the left and right sides). Therefore, the space required for operation of component mounting device 10 is compact. Also, because the specified region overlaps a space surrounded by reinforcement ribs 22b of the left and right sides that are configuration members of Y-axis slider 22, the space in which flexible section 56 can move is even more compact.

Meanwhile, it goes without saying that the disclosure is not limited to the above-mentioned embodiment and various embodiments may be applied within the technical scope of the disclosure.

According to an embodiment above, in component mounting device 10 in which X-axis slider 26 is attached to Y-axis slider 22 so as to be movable in the X-axis direction, Z-axis slider 29 is attached to X-axis slider 26 so as to be movable in the Z-axis direction, but the configuration is not limited to this. For example, in a component mounting device in which an X-axis slider is attached to a Y-axis slider so as to be movable in the Y-axis direction, a Z-axis slider may be attached to the Y-axis slider so as to be movable in the Z-axis direction. In this case, at least a portion of the Y-axis wiring tube and at least a portion of the Z-axis wiring tube may be bundled together in a flexible section, and the flexible section may be configured to be expandable and contractible in the movement direction of the Y-axis slider and in the movement direction of the Z-axis slider.

In an embodiment above, at least a portion of the X-axis wiring tube and at least a portion of the Z-axis wiring tube are bundled together in flexible section 56, but at least a portion of a Y-axis wiring tube may be bundled together as well.

In an embodiment above, flexible section 56 is configured such that at least a portion of the flexible X-axis wiring tube and at least a portion of the flexible Z-axis slider wiring tube are lined up in a horizontal manner (in one level) and fixed by resin. For example, these wiring tubes may be stacked in multiple levels (for example, two levels) and fixed with resin, a flexible tube into which these wiring tubes are inserted may be used as flexible section 56, or the wiring tubes may be bundled together with an appropriate gap between them and clamped together with a band as flexible section 56.

In an embodiment above, the space in which flexible section 56 moves in accordance with the movement of X-axis slider 26 and Z-axis slider 29 overlaps the space (the triangular shape) surrounded by reinforcement ribs 22b on the left and right sides of Y-axis slider 22, but, for example, the reinforcement ribs may be rectangular instead of an inverted right-angled triangle, and the space (a cuboid space) may be defined by being surrounded by the rectangular reinforcement ribs.

In an embodiment above, an intermediate portion of flexible section 56 is expandable and contractible in the X-axis direction and Z-axis direction by being C-shaped (U-shaped), but the form is not particularly limited so long as flexible section 56 is expandable and contractible in the X-axis direction and Z-axis direction. For example, an intermediate portion of flexible section 56 may be S-shaped. Also, so long as an intermediate portion of flexible section 56 is C-shaped (U-shaped) or S-shaped, other portions may be any form.

In an embodiment above, auto-tool 33 is provided with multiple suction nozzles 31 along a circumferential direction of a cylindrical body, but only one nozzle may be provided.

INDUSTRIAL APPLICABILITY

The present disclosure may be applied, for example, to a component mounting device or a component mounting system including a component mounting device.

REFERENCE SIGNS LIST

10; component mounting device; 11: main body frame; 11 a: Y-axis frame; 12: board conveyance unit; 14: conveyor belt; 16: support pin; 20: XY robot; 22: Y-axis slider; 22a: Y-axis frame; 22b: reinforcement rib; 23: guide; 24: Y-axis guide rail; 25: guide; 26: X-axis slider; 28: X-axis guide rail; 29: Z-axis slider; 29a: holding section; 29b: engaging section; 30: head; 30a: engaged section; 31: nozzle; 32: nozzle holder; 33: auto-tool; 34: R-axis motor; 35: θ-axis motor; 36: Z-axis motor; 37: nozzle raising and lowering mechanism; 38: frame; 50: Z-axis guide rail; 52: guide; 54: case; 56: flexible section; 66: component camera; 70: component supply unit; 72: reel; 74: feeder; 76: controller

The invention claimed is:

1. A component mounting device for picking up a component supplied from a component supply device, transporting the component to a specified position on a board, and mounting the component on the board, the component mounting device comprising:
    an XY robot including an X-axis slider and a Y-axis slider;
    a Z-axis slider attached to a front surface of the X-axis slider of the XY robot so as to be movable in a Z-axis direction;
    a head loaded on the Z-axis slider;
    a nozzle attached to the head so as to be movable in the Z-axis direction;
    a first wiring tube connected to a device loaded on the X-axis slider of the XY robot, the first wiring tube moving in accordance with operation of the X-axis slider of the XY robot;
    a second wiring tube connected to a device loaded on the Z-axis slider, the second wiring tube moving in accordance with operation of the Z-axis slider; and
    a flexible section in which at least a portion of the first wiring tube and at least a portion of the second wiring tube are bundled, the flexible section being capable of expanding and contracting in a movement direction of the Z-axis slider and a movement direction of the X-axis slider of the XY robot,
    wherein the Z-axis slider is provided with a case that extends from a lower section of the Z-axis slider passing a space below the Y-axis slider of the XY robot to a space on a rear side of the X-axis slider of the XY robot, and
    wherein the flexible section is provided at an intermediate section from the case to an upper section of the Y-axis slider at the space on the rear side of the X-axis slider of the XY robot.

2. The component mounting device according to claim 1, wherein
    the flexible section has an intermediate section with a U shape or an S shape when in a state with a first end of the flexible section positioned directly below a second end of the flexible section.

3. The component mounting device according to claim 1, wherein
    the flexible section is configured to bend so as not to protrude beyond a specified region of the space on the rear side of the X-axis slider of the XY robot.

4. The component mounting device according to claim 3, wherein
    the specified region overlaps a space surrounded by configuration members of the Y-axis slider of the XY robot.

* * * * *